US012703905B2

(12) United States Patent
Kim et al.

(10) Patent No.: US 12,703,905 B2
(45) Date of Patent: Aug. 11, 2026

(54) APPARATUS FOR MANUFACTURING MASK ASSEMBLY, METHOD FOR CALCULATING AUTO-TEACHING DATA USING THE SAME, AND METHOD FOR MANUFACTURING MASK ASSEMBLY USING AUTO-TEACHING DATA

(71) Applicant: Samsung Display Co., LTD., Yongin-si (KR)

(72) Inventors: Jeong-Su Kim, Yongin-si (KR); Jeyun Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 56 days.

(21) Appl. No.: 18/347,799

(22) Filed: Jul. 6, 2023

(65) Prior Publication Data

US 2024/0102146 A1 Mar. 28, 2024

(30) Foreign Application Priority Data

Sep. 22, 2022 (KR) ........................ 10-2022-0120137

(51) Int. Cl.
*C23C 14/04* (2006.01)
*C23C 14/24* (2006.01)

(52) U.S. Cl.
CPC ............ *C23C 14/042* (2013.01); *C23C 14/24* (2013.01)

(58) Field of Classification Search
CPC ...... C23C 14/042; C23C 14/24; H10K 71/00; H10K 71/166
See application file for complete search history.

(56) References Cited

U.S. PATENT DOCUMENTS 5,874,190 A * 2/1999 Tanaka ...................... G03F 9/00 430/22
10,286,416 B2 5/2019 Han et al.
2020/0230738 A1 7/2020 Jung et al.

FOREIGN PATENT DOCUMENTS

CN 102402129 B * 1/2015 ........... G03F 9/7049
JP 2019094529 A 6/2019
KR 101426199 B1 * 8/2014 ............. G06F 3/041
KR 20170005214 A 1/2017
KR 10-2019-0124610 11/2019
(Continued)

OTHER PUBLICATIONS

English Translation of "KR-101426199-B1" (Year: 2014).*
English Translation of "CN-102402129-B" (Year: 2015).*
English Translation of "KR-102230000-B1" (Year: 2021).*

*Primary Examiner* — Charles R Kasenge
(74) *Attorney, Agent, or Firm* — Lerner David LLP

(57) ABSTRACT

Provided are an apparatus for manufacturing a mask assembly, a method for calculating auto-teaching data using the same, and a method of manufacturing a mask assembly using position correction values calculated by auto-teaching data calculation. The apparatus for manufacturing a mask assembly includes a processing unit including a stage, a mask, a mask frame, and marking parts, a first gantry disposed on the processing unit and movable in a first direction, a second gantry connected to the first gantry and movable in a second direction intersecting the first direction, a photographing unit connected to the second gantry and that photographs the marking parts, and a movement control unit that controls movements of the first gantry and the second gantry.

8 Claims, 13 Drawing Sheets

(56) References Cited

FOREIGN PATENT DOCUMENTS

KR 10-2020-0091994 8/2020
KR 102230000 B1 * 3/2021 ........... C23C 16/042

* cited by examiner

MC
CP
UDD
CM
GT2
GT1
RLD
D2
G2
SS
BD
TS
G1
D1
PD
PR
PP
SP
MR
ST
DR1
DR2
DR3

MC
CP
UDD
CM
GT2
GT1
RLD
SS
BD
TS
LP
D2
G2
G1
D1
PD
PR
MR
MO
SP
ST
DR1
DR2
DR3

MC
CP
UDD
CM
GT2
GT1
RLD
SS
BD
TS
O-M
MK
O-F
FR
PD
PR
PP
SP
MR
ST
DR1
DR2
DR3

APPARATUS FOR MANUFACTURING MASK ASSEMBLY, METHOD FOR CALCULATING AUTO-TEACHING DATA USING THE SAME, AND METHOD FOR MANUFACTURING MASK ASSEMBLY USING AUTO-TEACHING DATA

CROSS-REFERENCE TO RELATED APPLICATIONS

This application claims priority to and benefits of Korean Patent Application No. 10-2022-0120137 under 35 U.S.C. § 119, filed on Sep. 22, 2022 in the Korean intellectual Property Office, the entire contents of which are incorporated herein by reference.

BACKGROUND

1. Technical Field

The disclosure relates to an apparatus for manufacturing a mask assembly, a method for calculating auto-teaching data using the same, and a method of manufacturing a mask assembly using auto-teaching data.

2. Description of the Related Art

A display device such as a television, a mobile phone, a tablet computer, a navigator, a game player, or the like is provided with a display panel for displaying an image. The display panel may include pixels composed of driving elements such as transistors and display elements such as organic light emitting diodes. The display elements may be provided by depositing electrodes, functional layers, and light emitting patterns on a substrate using a mask assembly.

The mask assembly may include a mask frame and a mask coupled to the mask frame. According to the reliability of the mask assembly, the reliability of a deposition pattern deposited using the mask assembly may vary. The reliability of the mask assembly may vary according to positions of openings in the mask, a degree of tension of the mask or the like during manufacturing the mask assembly. Therefore, it is necessary to study a method for manufacturing the mask assembly in order to improve the reliability of the mask assembly.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a method for calculating auto-teaching data, the method being able to improve processing reliability of a mask assembly, using an apparatus for manufacturing the mask assembly.

The disclosure also provides a method for manufacturing the mask assembly, the method being able to improve the processing reliability and reduce a processing time using position correction values calculated by the method for calculating auto-teaching data.

An embodiment provides an apparatus for manufacturing a mask assembly that may include a processing unit including a stage, a mask, a mask frame, and a plurality of marking parts; a first gantry disposed on the processing unit and movable in a first direction; a second gantry connected to the first gantry and movable in a second direction that crosses the first direction; a photographing unit connected to the second gantry and that photographs the plurality of marking parts; and a movement control unit that controls movements of the first gantry and the second gantry.

In an embodiment, the plurality of marking parts may be disposed in the first direction and the second direction on the stage.

In an embodiment, the plurality of marking parts may be disposed in the first direction and the second direction on the mask frame.

In an embodiment, the processing unit may further include a first support bar connected to the mask frame and extending in the first direction; and a second support bar connected to the mask frame and extending in the second direction, and the plurality of marking parts are disposed on any one of the first support bar and the second support bar.

In an embodiment, a plurality of openings may be defined in the mask, and the plurality of marking parts may be disposed on the mask spaced apart from the plurality of openings, and disposed along the first direction and the second direction.

In an embodiment, the processing unit may further include a plate disposed on the stage, and the plurality of marking parts may be disposed on the plate in the first direction and the second direction.

In an embodiment, the plate may include glass.

In an embodiment, the plurality of marking parts may include a first group including marking parts disposed in the first direction among the plurality of marking parts; and a second group including a plurality of marking parts disposed in the second direction among the plurality of marking parts, wherein the plurality of marking parts of the first group are spaced apart by a same interval in the first direction, and the plurality of marking parts of the second group are spaced apart by a same interval in the second direction.

In an embodiment, the apparatus for manufacturing a mask assembly may further include a tensioner disposed on the stage and that tensions the mask.

In an embodiment, the photographing unit may include a camera and strobe lighting that provides light to the processing unit.

In an embodiment, the movement control unit may output a signal in case that the first gantry or the second gantry moves by a selectable distance, and the photographing unit may receive the signal from the movement control unit to photograph the plurality of marking parts.

In an embodiment, the apparatus for manufacturing a mask assembly may further include a control unit that calculates position coordinates of each of the plurality of marking parts using images of the plurality of marking parts photographed by the photographing unit.

In an embodiment, a method for calculating auto-teaching data may include providing a processing unit including a stage, a plurality of marking parts, a mask, and a mask frame; at least one photographing unit stopping at and photographing each of the plurality of marking parts to calculate first position coordinates of each of the plurality of marking parts; the at least one photographing unit continuously moving along the plurality of marking parts and photographing the plurality of marking parts to calculate second position coordinates of each of the plurality of marking parts; and calculating position correction values using differences between the first position coordinates and the second position coordinates.

In an embodiment, the position correction values may correspond to average values of the differences between the first position coordinates and the second position coordinates of the plurality of marking parts.

In an embodiment, the plurality of marking parts may be disposed in a first direction and a second direction intersecting the first direction, among the plurality of marking parts, a plurality of marking parts disposed in the first direction may be disposed by a same first interval, and, among the plurality of marking parts, a plurality of marking parts disposed in the second direction may be disposed by a same second interval.

In an embodiment, the position correction values may include a first correction value corresponding to a position correction in the first direction and a second correction value corresponding to a position correction in the second direction, and the first and second correction values may be calculated independently from each other.

In an embodiment, the at least one photographing unit may include photographing units, and the photographing units may substantially simultaneously photograph a plurality of marking parts disposed at different positions among the plurality of marking parts.

In an embodiment, a method for manufacturing a mask assembly may include providing, on a photographing unit, a processing unit including a stage, a mask, and a mask frame; a movement control unit calculating corrected measurement position coordinates using position correction values calculated by a method for calculating auto-teaching data; the photographing unit photographing a plurality of openings in the mask, in case that positioning at the corrected measurement position coordinates while continuously moving on the mask; and setting a degree of tension of the mask using positions of the plurality of openings measured through photographed images of the plurality of openings, wherein the method for calculating auto-teaching data may include the photographing unit stopping at and photographing each of a plurality of marking parts provided in the processing unit to calculate first position coordinates of each of the plurality of marking parts; the photographing unit continuously moving along the plurality of marking parts and photographing the marking plurality of parts to calculate second position coordinates of each of the plurality of marking parts; and calculating the position correction values using differences between the first position coordinates and the second position coordinates.

In an embodiment, the movement control unit may output a signal to the photographing unit at each of the corrected measurement position coordinates, and the photographing unit may be turned on by the signal to photograph the plurality of openings of the mask.

In an embodiment, the method for manufacturing a mask assembly may further include tensioning the mask by the degree of tension and then welding the mask on the mask frame.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings:

FIG. 4 is a schematic plan view corresponding to one step of a method for calculating auto-teaching data according to an embodiment;

DETAILED DESCRIPTION OF THE EMBODIMENTS

Figure 1:
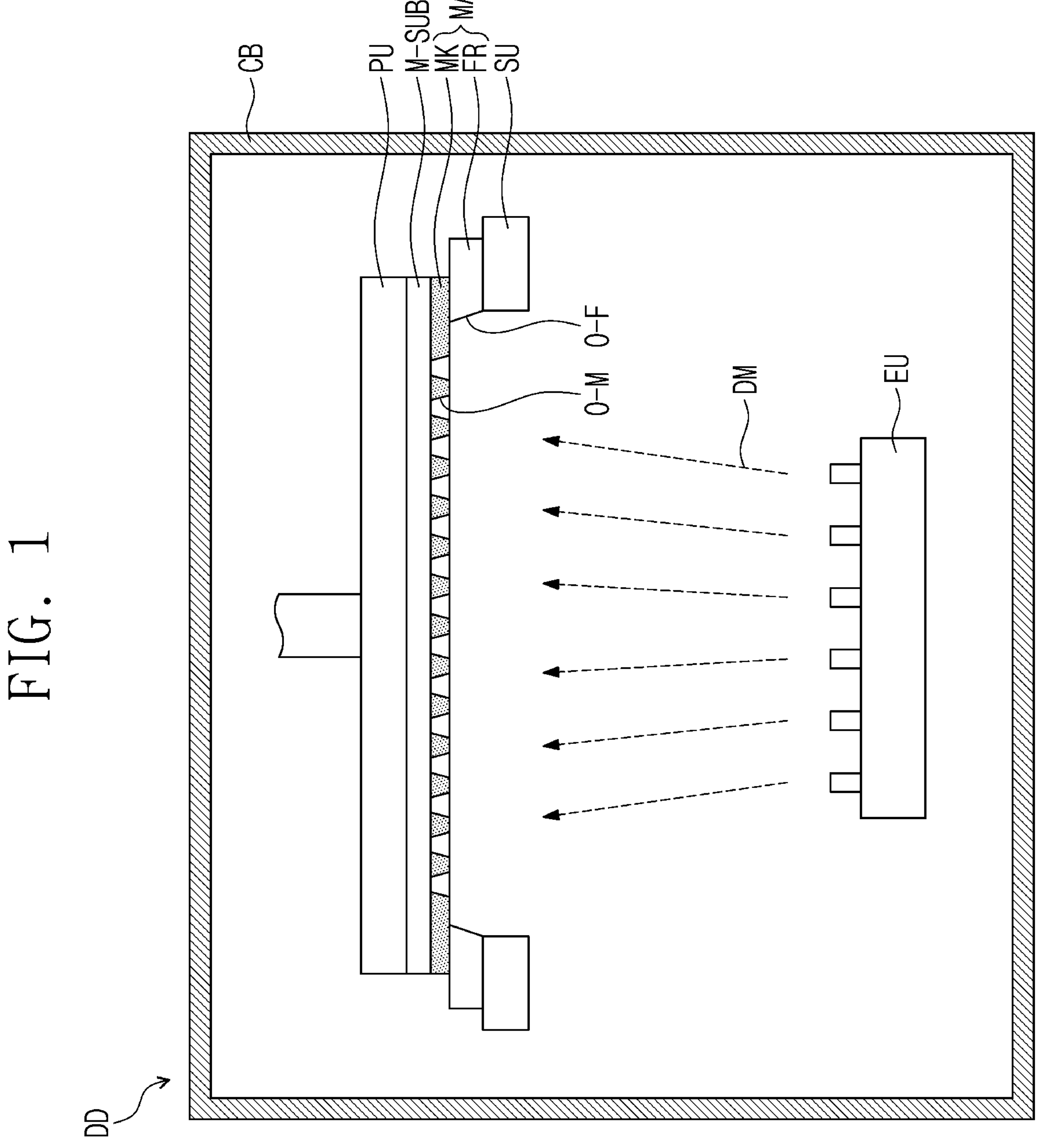
FIG. 1 is a schematic cross-sectional view of a deposition apparatus according to an embodiment.

The disclosure may be variously modified and realized in various forms, and thus embodiments will be illustrated in the drawings and described in detail hereinafter. However, it will be understood that the disclosure is not intended to be limited to the forms set forth herein, and all changes, equivalents, and substitutions included within the spirit scope of the disclosure are included.

It will be understood that when an element or layer is referred to as being "on", "to" or "coupled to" another element (or area, layer, portion or the like), it can be directly on, connected or coupled to the other element or intervening third elements may be present.

It will be understood that the terms "connected to" or "coupled to" may include a physical or electrical connection or coupling.

Like reference numerals in the drawings refer to like elements. In the drawings, the thickness and the ratio and the dimension of a given element may be exaggerated for effective description of the technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the disclosure.

The terms such as "under", "lower", "on", and "upper" are used for explaining associations of items illustrated in the drawings. It will be understood that the spatially relative terms are intended to encompass different orientations of the device in use or operation in addition to the orientation depicted in the figures but is not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, descriptions will be provided about an apparatus for manufacturing a mask assembly, a method for calculating auto-teaching data using the apparatus for manufacturing a mask assembly, and a method for manufacturing a mask assembly using position correction values calculated by the method for calculating auto-teaching data.

FIG. 1 is a schematic cross-sectional view of a deposition device DD according to an embodiment.

Referring to FIG. 1, the deposition device DD may include a chamber CB, an evaporation unit EU, a fixing unit PU, a support unit SU, and a mask assembly MA. The deposition device DD according to an embodiment may further include an additional machine device for implementing an in-line system.

The mask assembly MA included in the deposition device DD may be manufactured using an apparatus PD for manufacturing a mask assembly (see FIG. 3A) according to the disclosure. The mask assembly MA according to an embodiment may be used for manufacturing an electronic device such as a display panel. For example, one or more functional layers included in the display panel may be provided through a deposition process using the deposition device DD including the mask assembly MA.

The chamber CB may include a bottom surface, a ceiling surface, and side walls that provide the internal space. The bottom surface of the chamber CB may face the ceiling surface, and the side walls may connect the bottom surface and the ceiling surface. In the internal space of the chamber CB, the evaporation unit EU, the fixing unit PU, the support unit SU, the mask assembly MA, and a mother substrate M-SUB may be disposed.

The chamber CB may provide a closed space set as a vacuum deposition condition. The chamber CB may be provided with at least one gate, and be open and closed through the gate. The mask assembly MA and the mother substrate M-SUB may be put in and out of the chamber CB through the gate.

The fixing unit PU may be disposed on the evaporation unit EU inside the chamber CB. The fixing unit PU may fix the mask assembly MA. For example, the fixing unit PU according to an embodiment may include a jig or a robot arm that holds the mask assembly MA. The fixing unit PU may include magnetic materials for bringing the mask assembly MA close to the mother substrate M-SUB. For example, the magnetic materials may generate a magnetic force to apply an attraction force to the mask assembly MA, and accordingly the mother substrate M-SUB disposed between the mask assembly MA and the fixing unit PU may be brought close to the mask assembly MA.

The mother substrate M-SUB may be an object-to-be-processed on which a deposition material DM is deposited. For example, the mother substrate M-SUB may include a support substrate and a synthetic resin layer disposed on the support substrate. For example, the deposition device DD may be used for manufacturing a display panel, and according to the configuration of the display panel to be provided using the deposition device DD, the mother substrate M-SUB may include the synthetic resin layer and some or a number of components, disposed on the synthetic resin layer, of the display panel.

The evaporation unit EU may be disposed facing the fixing unit PU inside the chamber CB. The evaporation unit EU may include a space in which the deposition material DM is accommodated and one or more nozzles that sprays the deposition material DM. The deposition material DM may include an inorganic material, a metal, or an organic material that may be sublimed or vaporized. The deposition material DM may pass through the mask assembly MA to be deposited on the mother substrate M-SUB in a prescribed pattern.

The mask assembly MA may include a mask MK and a mask frame FR. The mask MK may be disposed on the mask frame FR. The mask MK may be combined with the mask frame FR using the apparatus PD for manufacturing a mask assembly (see FIG. 3A) according to an embodiment.

The mask frame FR may support the mask MK. A frame openings O-F may be defined inside the mask frame FR. The mask frame FR may have a closed line shape surrounding the frame opening O-F in a plan view. However, the shape of the mask frame FR may not be limited to any one, if the mask frame FR supports the mask MK.

The mask frame FR may have a rigidity. For example, the mask frame FR may include a metal material such as stainless steel (SUS), an invar alloy, nickel (Ni), or cobalt (Co). However, the material of the mask frame FR is not limited thereto.

The openings O-M, which are provided to penetrate through the mask MK, may be defined in the mask MK. The openings O-M may overlap the frame opening O-F. The openings O-M may define an area in which the deposition pattern is provided on the mother substrate M-SUB. In other words, the deposition material DM may penetrate through the frame opening O-F and the openings O-M of the mask MK to be deposited in a prescribed pattern corresponding to the openings O-M on a deposition surface of the mother substrate M-SUB.

The mask MK may be provided in plurality to overlap the frame opening O-F on one mask frame FR and be arranged (or disposed) along one direction or a direction. However, an embodiment is not limited thereto, and the mask MK may be provided as a single mask to be disposed on the mask frame FR.

The mask MK may include a metal material having a small coefficient of thermal expansion. For example, the mask MK may include an invar alloy, a nickel (Ni)-cobalt (Co) alloy, a nickel (Ni)-iron (Fe) alloy or the like within the spirit and the scope of the disclosure. However, the material of the mask MK is not limited thereto.

The support unit SU may be disposed between the evaporation unit EU and the fixing unit PU to support the mask frame FR. The support unit SU may be disposed outside a migration pathway of the deposition material DM supplied toward the mother substrate M-SUB from the evaporation unit EU.

The support unit SU may provide a support surface that supports the mask frame FR. According to an embodiment, the support surface of the support unit SU may be provided in parallel to the bottom surface of the chamber CB to perform a horizontal deposition process. However, an embodiment is not limited thereto, and the support surface of the support unit SU may be provided vertically to the bottom surface of the chamber CB to perform a vertical deposition process.

Figure 2A:
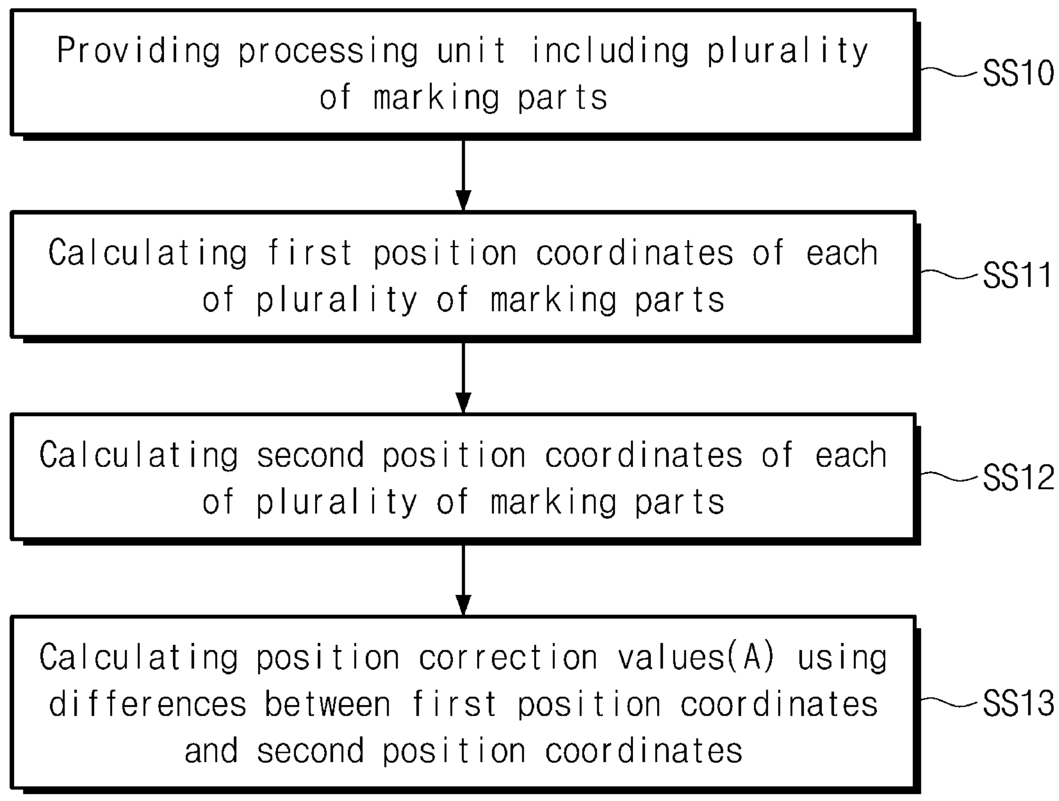
FIG. 2A is a flowchart of a method for calculating auto-teaching data according to an embodiment.
Figure 2B:
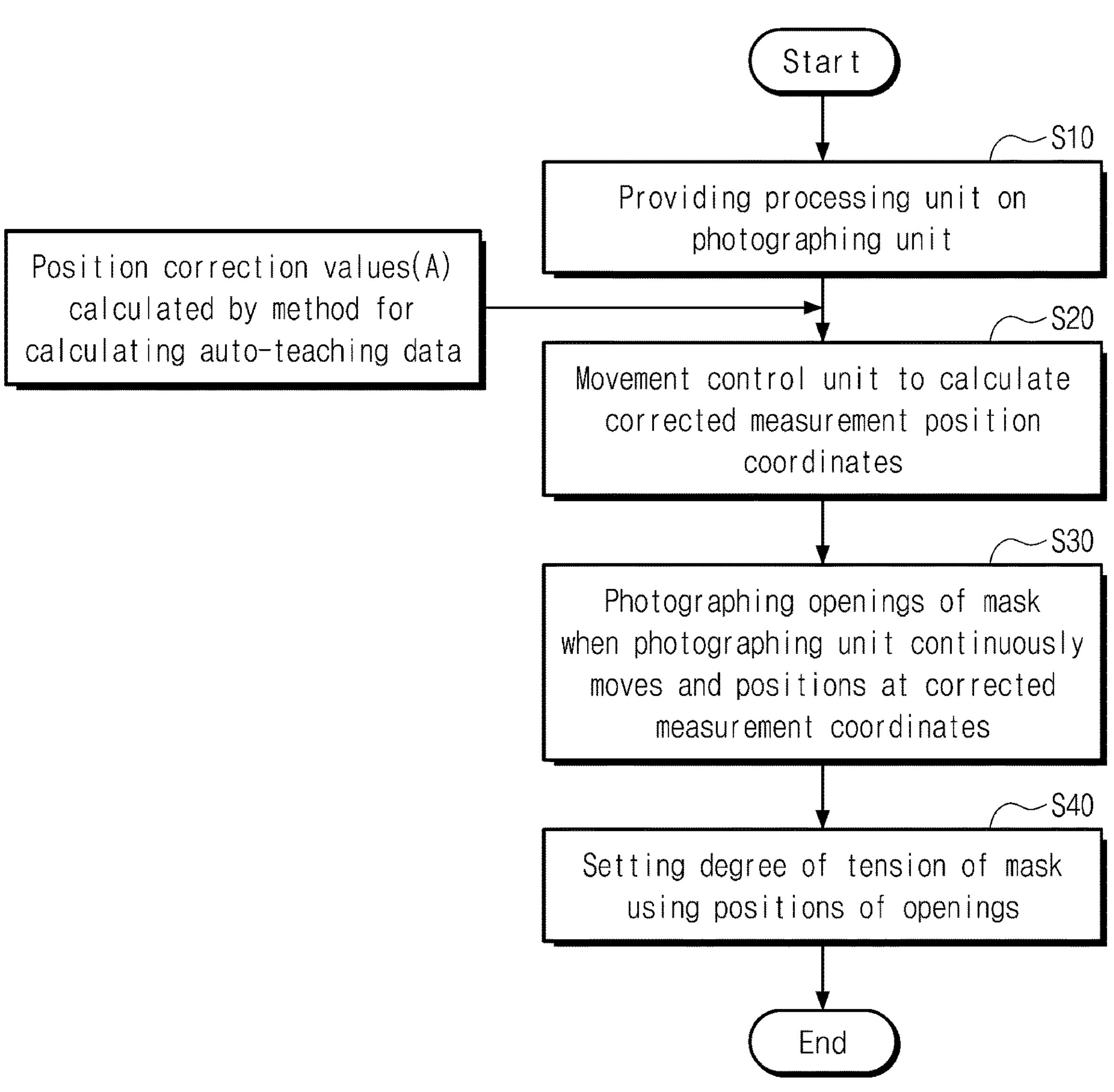
FIG. 2B is a flowchart illustrating a method for manufacturing a mask assembly according to an embodiment.

FIG. 2A is a flowchart of the method for calculating auto-teaching data according to an embodiment. FIG. 2B is a flowchart illustrating the method for manufacturing a mask assembly according to an embodiment.

Figure 3A:
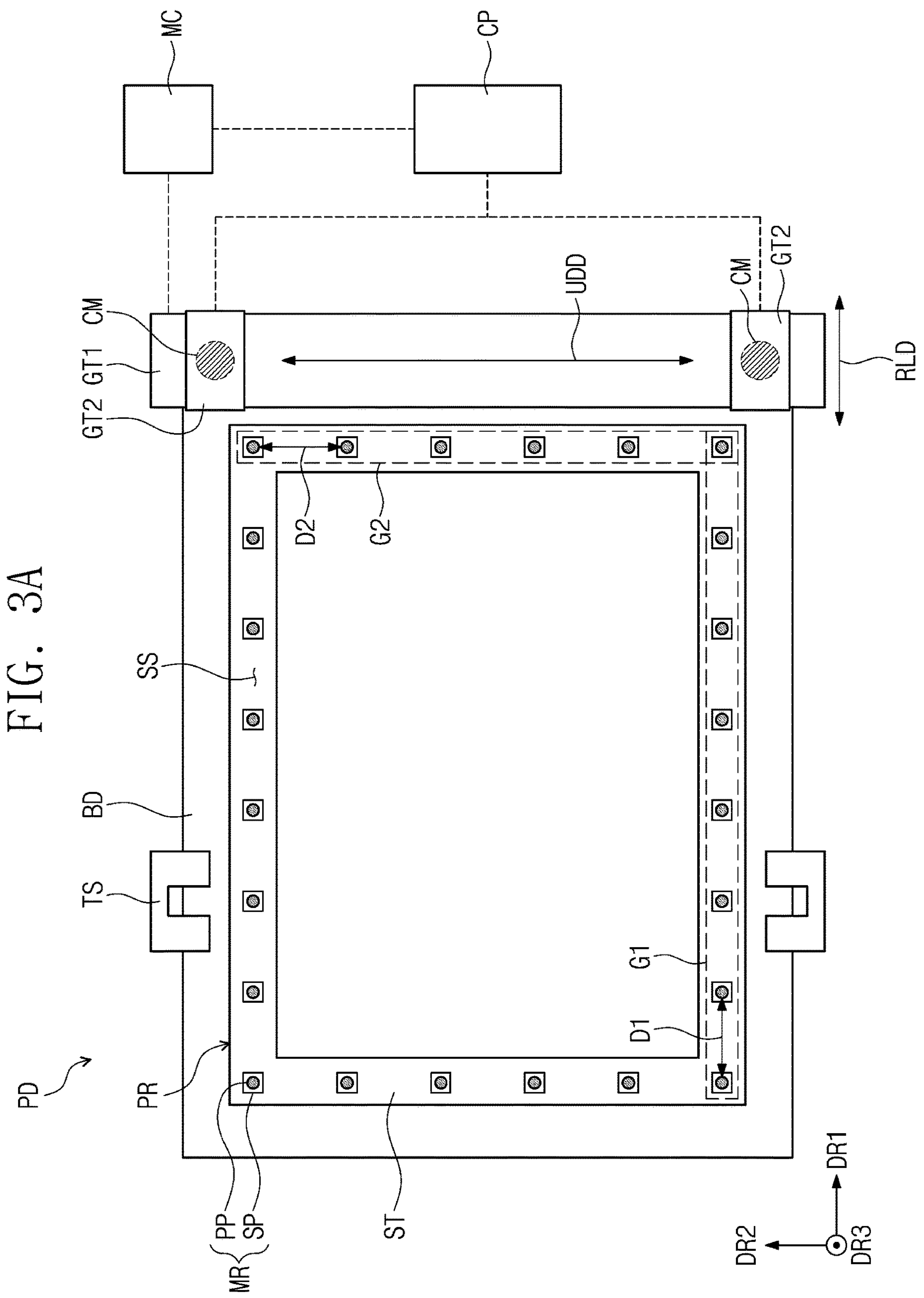
FIGS. 3A and 3B are schematic plan views of apparatuses for manufacturing a mask assembly according to an embodiment.
Figure 3B:
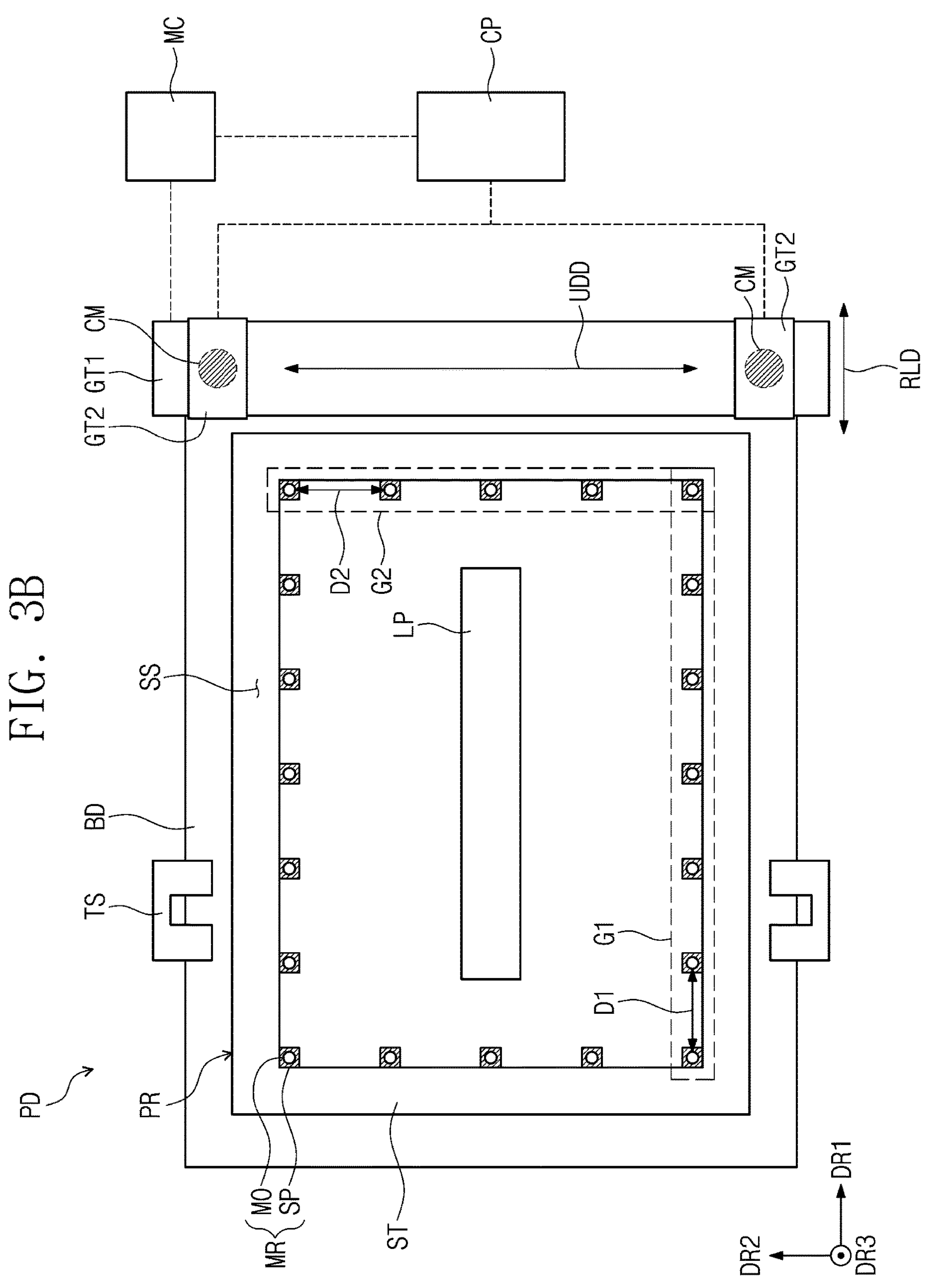

FIGS. 3A and 3B are schematic plan views of the apparatus PD of manufacturing a mask assembly according to an embodiment. The apparatus PD for manufacturing a mask assembly include the substantially same configuration and have a partial difference in embodiments of the marking units MR.

Hereinafter, with reference to FIGS. 2A, 2B, 3A, and 3B, descriptions will be provided about a step the method for calculating auto-teaching data using the apparatus PD for manufacturing a mask assembly, and the method for manufacturing a mask assembly.

Referring to FIG. 2A, position correction values A may be finally calculated through the method for calculating auto-teaching data according to an embodiment. The method for calculating auto-teaching data according to an embodiment may include: a step SS10 for providing a processing unit including marking parts, a step SS11 for calculating first position coordinates of each of the marking parts, a step SS12 for calculating second position coordinates of each of the marking parts, and a step SS13 for calculating the position coordinate values A using the differences between the first position coordinates and the second position coordinates, respectively. The position correction values A calculated by the method for calculating auto-teaching data may be used for the method for manufacturing a mask assembly.

Referring to FIG. 2B, the method for manufacturing a mask assembly according to an embodiment may include a step S10 for providing the processing unit on a photographing unit, a step S20 for a movement control unit to calculate corrected measurement position coordinates; a step S30 for the photographing unit to photograph the openings of the mask; and a step S40 for setting a degree of tension of the mask using the positions of the openings. The position correction values A calculated by the method for calculating auto-teaching data may be used for the step S20 for the movement control unit to calculate the corrected measurement position coordinates.

The step of the method for calculating auto-teaching data for calculating the position correction values A may be the step prior to an initial mask assembly manufacturing process, and initially calculated position correction values A may be continuously used in repeated mass production of the mask assembly. In other words, after the position correction values A is applied to the movement control unit in the initial mask assembly manufacturing process, the steps SS10 to SS13 (see FIG. 2A) in the method for calculating auto-teaching data may be omitted, and the movement control unit to which the position correction values A are applied may be continuously used for the mass production of the mask assembly.

The corrected measurement position coordinates calculated using the position correction values A in the movement control unit may correspond to the positions at which the photographing unit photographs the mask. In other words, the photographing unit may photograph the openings of the mask at respective instants in case that positioning at the corrected measurement position coordinates while continuously moving on the mask.

The images of the openings photographed by the photographing unit may be used for measuring the positions of the openings. According to the positions at which the openings are provided within the mask in the step S40 for setting the degree of tension of the mask, it may be set in which direction and how strongly the mask is tensioned.

Hereinafter, the steps of the method for calculating auto-teaching data and the method for manufacturing a mask assembly will be described in detail with reference to the accompanying drawings.

Referring to FIGS. 3A and 3B, the apparatus PD for manufacturing a mask assembly may include a body unit BD, a processing unit PR, a first gantry GT1, a second gantry GT2, a tensioner TS, a photographing unit CM, a movement control unit MC, and a control unit CP.

The processing unit PR provided in a processing unit providing step SS10 in the method for calculating auto-teaching data may include the marking parts MR, the stage ST, and a processing target, and the marking parts MR may be disposed on at least one of the stage ST or the processing target. For example, the marking parts MR may be disposed on the stage ST, or on the mask frame FR or the mask MK constituting the processing target. The disposition position of the marking parts MR is not limited to any one, if not interrupting driving of other components within the apparatus PD for manufacturing a mask assembly.

The processing unit PR may be provided on the body unit BD of the apparatus PD for manufacturing a mask assembly. The body unit BD may support the stage ST and the processing target. In FIG. 3A, for convenience of description, the mask MK and the mask frame FR, which are the processing target in the processing unit PR, are omitted.

The body unit BD may support the stage ST on a plane parallel to a first direction DR1 and a second direction DR2 that is perpendicular to the first direction DR1. A third direction DR3 may be parallel to a normal direction to the plane defined by the first direction DR1 and the second direction DR2. In the specification, "in a plan view" is set on the basis of a plane parallel to the plane defined by the first direction DR1 and the second direction DR2, and indicates a state viewed from the third direction DR3.

On the body unit BD, a process for calculating the position correction values A or a process for manufacturing the mask assembly MA (see FIG. 1) may be performed. For example, on the body unit BD, a process for calculating the position coordinates of the marking parts MR using the photographing unit CM in order to calculate the position correction values A, a process for tensioning the mask MK (see FIG. 6) using the tensioner TS in order to manufacture the mask assembly MA (see FIG. 1), a process for combining the mask MK (see FIG. 6) to the mask frame FR (see FIG. 6) or the like may be performed.

The first gantry GT1 may be disposed on the body unit BD. On the body unit BD, a guide unit that guides a moving direction of the first gantry GT1 may be disposed, and the first gantry GT1 may move along an extension direction of the guide unit. For example, the first gantry GT1 may move in a direction parallel to the first direction DR1, and be provided on the stage ST. However, a driving manner of the first gantry GT1 is not limited to any one, if the first gantry GT1 moves along one direction or in a direction. In an embodiment, a direction parallel to the first direction DR1 is defined as a left-and-right direction RLD. Accordingly, the first gantry GT1 may move in the left-and-right direction RLD on the body unit BD.

The second gantry GT2 may be connected to the first gantry GT1 to move in a direction parallel to the second direction DR2. For example, the first gantry GT1 may extend along the second direction DR2, and the second gantry GT2 connected to the first gantry GT1 may move along an extension direction of the first gantry GT1. However, a driving manner of the second gantry GT2 is not limited to any one, if the second gantry GT2 moves in a vertical direction to the movement direction of the first gantry GT1. In an embodiment, a direction parallel to the second direction DR2 is defined as an up-and-down direction UDD. Accordingly, the second gantry GT2 may move in the up-and-down direction UDD.

The left-and-right direction RLD and the up-and-down direction UDD defined in an embodiment may be relative concepts and change according to a direction of viewing.

The second gantry GT2 may be provided in plurality, and the second gantries GT2 may be arranged along the second direction DR2. Each of the second gantries GT2 may move in the up-and-down direction UDD. The second gantries GT2 may be interlinked and move, but are not limited thereto. They may move independently from each other.

The photographing unit CM may be connected to the second gantry GT2. Thus, the photographing unit CM may move according to the movements of the first and second gantries GT1 and GT2. For example, the photographing unit CM may move in the left-and-right direction RLD by the movement of the first gantry GT1, and move in the up-and-down direction UDD by the movement to the second gantry GT2. In other words, the photographing unit CM may photograph the processing unit PR while moving in the left-and-right direction RLD and in the up-and-down direction UDD according to the movements of the first and second gantries GT1 and GT2.

The photographing unit CM may be provided in plurality to be respectively arranged in the second gantries GT2. The photographing units CM may move independently from each other and photograph the processing unit PR substantially at the same time. Accordingly, a time taken to photograph the processing unit PR may be reduced. In FIG. 3A, two example photographing units CM are shown, but the number of photographing units CM included in the apparatus PD for manufacturing a mask assembly is not limited thereto.

The photographing unit CM may include a camera that photographs the processing unit PR and an optical source that emits light onto the processing unit PR. For example, the optical source may be strobe lighting that emits light instantaneously. As the optical source is provided as the strobe lighting, an image photographed by the photographing unit CM may be sharp despite of the movement of the photographing unit CM, as if the photographing unit CM photographed the image at a stop position. However, an embodiment is not limited thereto, and the optical source may be interconverted from the strobe lighting to lighting that continuously provides light.

The stage ST may be disposed on the body unit BD. The stage ST may be a part that supports the mask frame FR (see FIG. 6) in the process for calculating the auto-teaching data or a process for manufacturing the mask assembly. In other words, the stage ST may include a seating surface SS parallel to the first direction DR1 and the second direction DR2, and the mask frame FR (see FIG. 6) may be disposed on the seating surface SS.

The stage ST may have the shape corresponding to the shape of the mask frame FR in a plan view. For example, the stage ST may include parts extending in the first direction DR1 or the second direction DR2, and the parts of the stage ST may be interconnected with each other to make an opening space therein. However, the shape of the stage ST is not limited to any one shape if the stage ST supports the mask frame FR.

The marking parts MR according to an embodiment may be disposed on the stage ST. The marking parts MR may be arranged along the first direction DR1 and the second direction DR2. The marking parts MR may be grouped into groups G1 and G2. Among the marking parts MR, marking parts MR arranged in parallel along the first direction DR1 may be defined as a first group G1, and marking parts MR arranged in parallel along the second direction DR2 may be defined as a second group G2.

Each of the first group G1 and the second group G2 of the marking parts MR may be provided in plurality. The first groups G1 may be arranged to be spaced apart in the second direction DR2. The second groups G2 may be arranged to be spaced apart in the first direction DR1.

The marking parts MR of the first group G1 may be arranged to be spaced apart by a first interval D1 in the first direction DR1 and the first intervals D1 between the marking parts MR of the first group G1 may be the same as each other. For example, the first interval D1 may correspond to an interval between patterns PP of the marking parts MR in the first group G1. The marking parts MR of the second group G2 may be spaced apart by a second interval D2 in the second direction DR2 and the second intervals D2 between the marking parts MR of the second group G2 may be the same as each other. For example, the second interval D2 may correspond to an interval between patterns PP of the marking parts MR in the second group G2.

The first interval D1 and the second interval D2 may have different sizes. However, an embodiment is not limited thereto, and the first interval D1 may have a same size as the second interval D2. In case that the marking parts MR are arranged to be spaced apart by a selectable interval along a selectable direction, the sizes of the first interval D1 and the second interval D2 are not limited to any one.

The marking parts MR may be components used for calculating the position correction values A. For example, the position correction values A may be calculated using images, of the marking parts MR, photographed by the photographing unit CM. Accordingly, an embodiment of the marking parts MR is not limited to any one, if an image from which the shapes and positions of the marking parts MR may be recognized may be obtained through the photographing unit CM.

According to an embodiment shown in FIG. 3A, each of the marking parts MR may include a support body SP and the pattern PP disposed on the support body SP. The support body SP and the pattern PP may include different materials, and a light transmittance of the support body SP may be different from that of the pattern PP. For example, the support body SP may include a transparent material having a high light transmittance, and the pattern PP may include a metal material having a high light reflectance in comparison to the support SP. However, the materials of the support body SP and the pattern PP are not limited to any one, if the pattern PP is recognizable through the photographed image.

In an embodiment, each support body SP of the marking parts MR may be omitted. The marking parts MR may be provided as the patterns PP, respectively, and the patterns PP may be directly provided on the stage ST.

The pattern PP may have a circular shape in a plan view. However, an embodiment is not limited thereto, and the pattern PP may have a standardized polygonal shape such as a diamond or cross shape. The shape of the pattern PP is not limited to any one, if the position of the pattern PP may be calculated through the photographed image of the pattern PP.

According to an embodiment shown in FIG. 3B, each of the marking parts MR may include a support body SP and a marking opening MO that penetrates through the support body SP. The apparatus PD for manufacturing a mask assembly may further include a light emitting unit LP that emits light toward the marking parts MR and the photographing unit CM under or below the marking parts MR. The support body SP may include a material having a low light transmittance, and light emitted from the light emitting unit LP may penetrate through the marking openings MO of the marking parts MR to be incident to the photographing unit CM. Accordingly, the marking openings MO may be photographed, by the photographing unit CM, so that the shapes of the marking openings MO are recognized.

Each of the marking openings MO may have a circular shape in a plan view. However, an embodiment is not limited thereto, and each of the marking openings MO may have a standardized polygonal shape such as a diamond or cross shape. The shape of each of the marking openings MO is not limited to any one, if the positions of the marking openings MO may be calculated through the photographed image of the marking openings MO.

Figure 6:
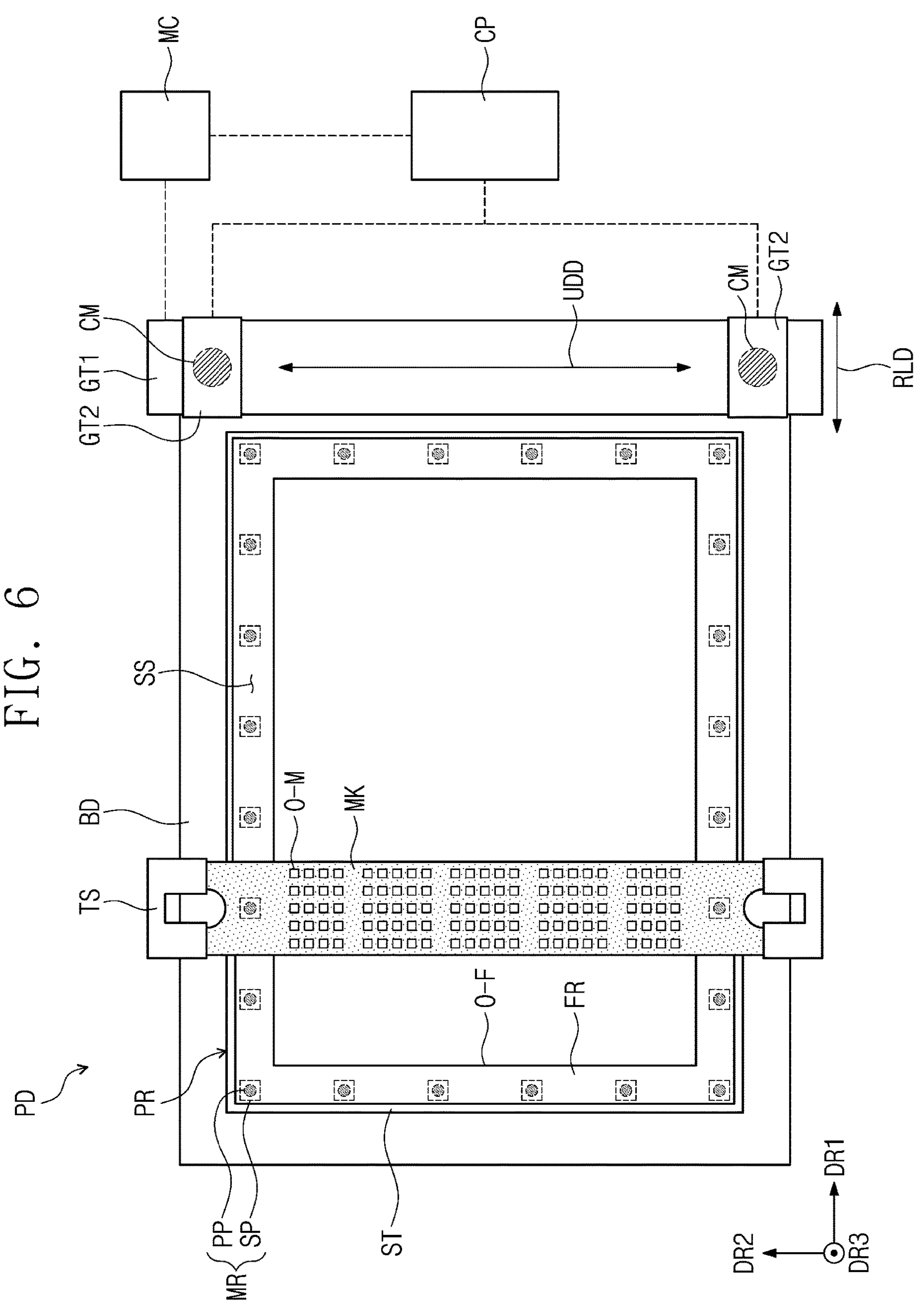
FIG. 6 is a schematic plan view of an apparatus for manufacturing a mask assembly according to an embodiment.

The tensioner TS may be an apparatus for tensioning the mask MK (see FIG. 6) in a process for tensioning the mask MK (see FIG. 6). The tensioner TS may be disposed on one side of the body unit BD. For example, the tensioner TS may be provided in plurality, and be respectively disposed on both sides of the body unit BD that are parallel to the first direction DR1. The tensioners TS may be disposed opposite to each other in the second direction DR2, and tension the mask MK (see FIG. 6) in a direction parallel to the second direction DR2. However, the disposition of the tensioners TS is not limited to the shown in FIGS. 3A and 3B. For example, the tensioner TS may be disposed on a support surface of the body unit BD to adsorb the mask MK in the third direction DR3 and tension the mask MK (see FIG. 6). By way of example, the tensioner TS may be provided in plurality to be respectively arranged on both sides of the body unit BD, which are parallel to the second direction DR2, so as to face each other in the first direction DR1.

The movement control unit MC may be connected to the first and second gantries GT1 and GT2 to control the movements of the first and second gantries GT1 and GT2. In the movement control unit MC, movement position coordinates corresponding to the movement positions of the first and second gantries GT1 and GT2 may be set. In other words, the first and second gantries GT1 and GT2 may move so as to position at the measurement position coordinates set in the movement control units MC according to a signal provided from the movement control unit MC.

The control unit CP may be connected to the photographing unit CM and the movement control unit MC. The movement control unit MC may transfer the signal to the control unit CP for each set the measurement position coordinates, and the control unit CP may transfer, as a trigger signal, the signal, which is from the movement control unit MC and corresponds to the measurement position coordinates, to the photographing unit CM to turn on the photographing unit CM. In case that ever the first and second gantries GT1 and GT2 position at the measurement position coordinates, the photographing unit CM may receive the trigger signal from the control unit CP to be turned on and photograph the processing unit PR.

According to an embodiment, the movement control unit MC and the control unit CP may be provided as separate components to be connected to each other. However, an embodiment is not limited thereto, and the movement control unit MC and the control unit CP may also be provided as a single control unit that controls all of the movements of the first and second gantries GT1 and GT2 and the operation of the photographing unit CM.

The photographing unit CM may provide the photographed image of the processing unit PR to the control unit CP, and the control unit CP may analyze the photographed image. For example, in calculating the auto-teaching data, the control unit CP may analyze the photographed image of the marking units MR to calculate the position coordinates of the marking parts MR, or in manufacturing the mask assembly MA (see FIG. 1), may analyze the photographed image of the masks MK (see FIG. 6) to calculate an arrangement state of the masks MK (see FIG. 6) or the position coordinates of the openings O-M (see FIG. 6) provided in the mask MS (see FIG. 6). In other words, information calculated through the control unit CP may be used for calculating the position correction values A or manufacturing the mask assembly, and through this, the mask assembly MA (see FIG. 1) having improved reliability may be manufactured.

In an embodiment, for improving the reliability of the process for manufacturing a mask assembly, the position correction values A, which correspond to the auto-teaching data, may be calculated using the marking parts MR in the apparatus PD for manufacturing a mask assembly. In manufacturing the mask assembly, the position correction values A may be applied to the movement control unit MC to correct the measurement position coordinates, and thus the mask assembly MA (see FIG. 1) having improved reliability may be manufactured.

Figure 4:
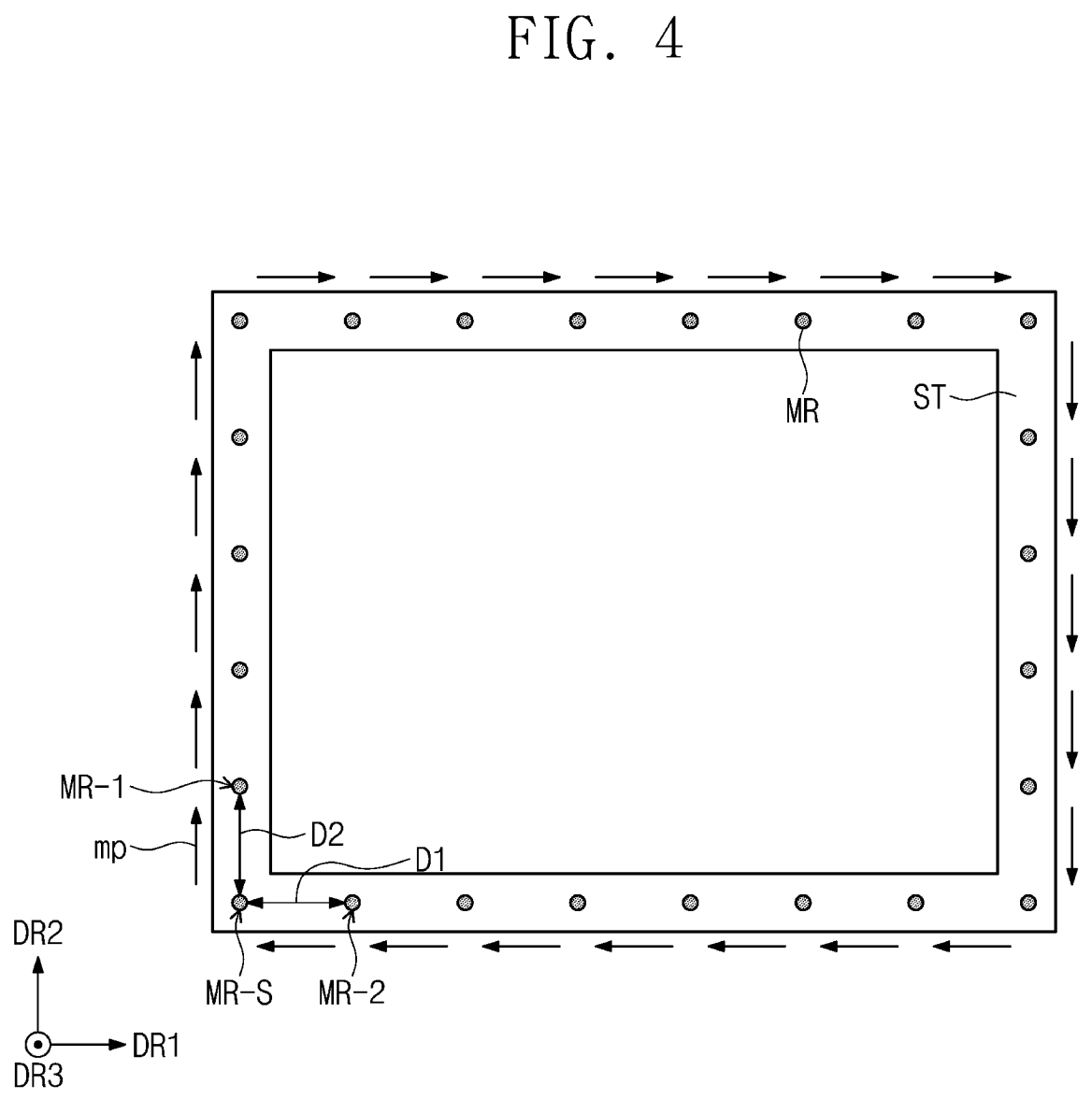
Figure 5A:
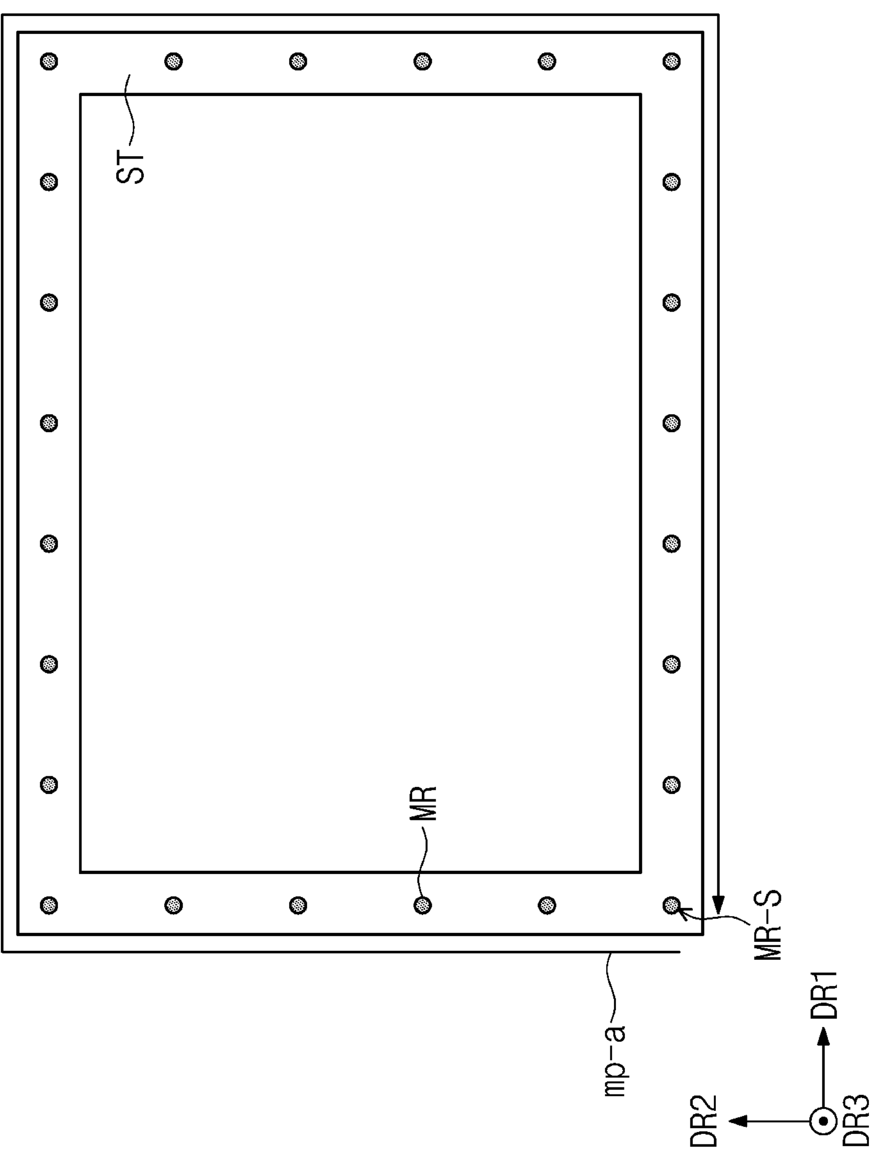
FIGS. 5A and 5B are schematic plan views corresponding to one step of a method for calculating auto-teaching data according to an embodiment.
Figure 5B:
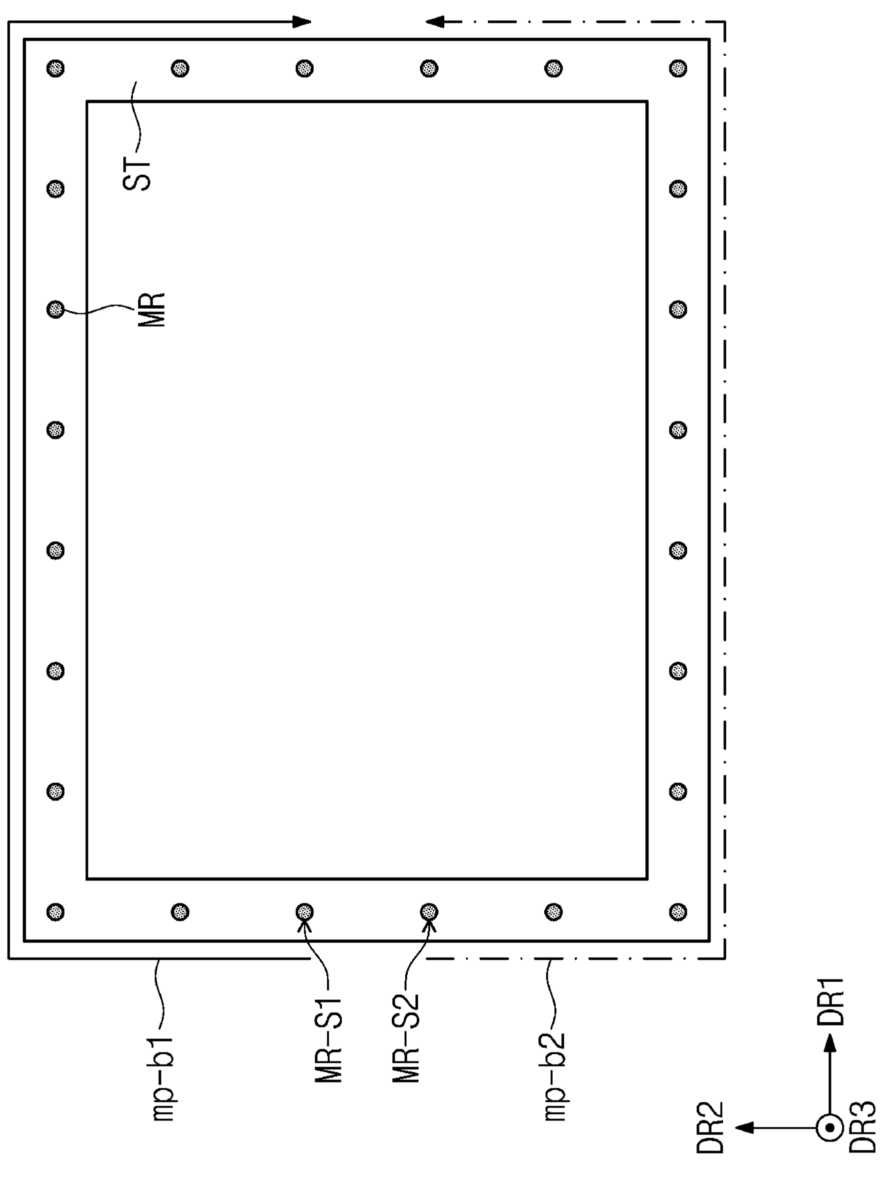

FIGS. 4, 5A, and 5B are schematic plan views corresponding to the steps of the method for calculating auto-teaching data according to an embodiment, and, for convenience of description, only the stage ST and the marking parts MR disposed on the stage ST are shown among the components of the apparatus PD for manufacturing a mask assembly. The steps of the method for calculating auto-teaching data in FIG. 2A will be described with reference to FIGS. 4, 5A, and 5B.

FIGS. 4, 5A, and 5B show embodiments in which the marking parts MR are provided as the pattern PP (see FIG. 3A). However, descriptions about each step of the method for calculating auto-teaching data may be applied identically to an embodiment of the marking parts MR including the marking opening MO (see FIG. 3B).

Referring to FIGS. 3A and 4, in the step SS11 for calculating first position coordinates of the marking parts MR, the first position coordinates of the marking parts MR may be calculated through images obtained by the photographing unit CM stopping at and photographing each of the marking parts MR. In other words, the first and second gantries GT1 and GT2 may stop at a position at which each of the marking parts MR is disposed, and the photographing unit CM in a stop state may photograph a corresponding marking part MR among the marking parts MR. The image photographed for each of the marking parts MR may be transferred to the control unit CP, and the control unit CP may calculate the first position coordinates of each of the marking parts MR through the photographed images of the marking parts MR.

FIG. 4 briefly illustrates, as an arrow, a movement path mp of the photographing unit CM connected to the first and second gantries GT1 and GT2. Referring to FIG. 4, a reference marking part MR-S, from which photographing by the photographing unit CM starts, may be defined. The reference marking part MR-S is photographed, and the photographing unit CM may move in the second direction DR2 to stop on the marking part MR-1 spaced apart by the second interval D2 from the reference marking part MR-S in the second direction DR2. The photographing unit CM may stop and photograph the corresponding marking part MR-1, and move again in the second direction DR2.

In other words, the first and second gantries GT1 and GT2 may move along a direction in which the marking parts MR are arranged, and stop at positions at which the marking parts are respectively disposed. The photographing unit CM may photograph a marking part MR corresponding to a photographing target in a state where the first and second gantries GT1 and GT2 stop. Accordingly, the photographing unit CM may repeat movement, stop, and photographing along the arrangement of the marking parts MR to photograph the marking parts MR. On the basis of the movement path mp shown in FIG. 4, a marking part MR-2 spaced apart by the first interval D1 from the reference marking part MR-S in the first direction DR1 may be finally photographed.

The movement path mp of the photographing unit CM shown in FIG. 4 is an example, and is not limited to any one, if all the marking parts MR disposed in the apparatus PD (see FIG. 3A) for manufacturing a mask assembly are photographed.

The images photographed by the photographing unit CM may be used for calculating the first position coordinates of each of the marking parts MR. Since the photographing unit CM stops and photographs each of the marking parts MR, each of the marking part MR may be sharply photographed, and the marking parts MR may not be shifted in their positions in the images of the marking parts MR. Accordingly, the reliability of the first position coordinates of the marking parts MR may be improved, wherein the first position coordinates are calculated in the step SS11 for calculating the first position coordinates of the marking parts MR.

The relative positions of the marking parts MR may be confirmed through the first position coordinates of the marking parts MR. If it is assumed that the first position coordinates of the reference marking part MR-S are (0, 0), the first position coordinates of the marking part MR-1 adjacent to the reference marking part MR-S in the second direction DR2 may correspond to (0, D2), and the first position coordinates of the marking part MR-2 adjacent to the reference marking part MR-S in the first direction DR1 may correspond to (D1, 0).

Referring to FIGS. 3A, 5A, and 5B, the first position coordinates of the marking parts MR are calculated, and second position coordinates of the marking parts MR may be calculated using the photographing unit CM. In the step SS12 for calculating the second position coordinates of the marking parts MR, the second position coordinates of the marking parts MR may be calculated through the images obtained by the photographing unit CM that continuously moves along the arrangement of the marking parts MR and photographs each of the marking parts MR. In other words, due to the first and second gantries GT1 and GT2, the photographing unit CM does not stop on the marking parts MR but may continuously move and photograph instant images of the marking parts MR. While the photographing unit CM continuously moves, the control unit CP may transfer the trigger signal to the photographing unit CM to turn on the photographing unit CM at the time in case that the photographing unit CM passes by the marking parts MR, and through this, the photographing unit CM may photograph the instant images of the marking parts MR. The second position coordinates of the marking parts MR may be calculated using the photographed images of the marking parts MR, wherein the images are photographed while the photographing unit CM continuously moves on the marking parts MR.

FIG. 5A briefly illustrates, as an arrow, the movement path mp-a of the photographing unit CM connected to the first and second gantries GT1 and GT2. Referring to FIG. 5A, the reference marking part MR-S, from which photographing by the photographing unit CM starts, may be defined. The photographing unit CM may photograph the marking parts MR from the reference marking part MR-S, while continuously moving without stopping along a direction in which the marking parts MR are arranged. On the basis of the movement path mp-a shown in FIG. 5A, the photographing unit CM may photograph the marking parts MR while continuously moving in an upward direction parallel to the second direction DR2, a rightward direction parallel to the first direction DR1, a downward direction parallel to the second direction DR2, and a leftward direction parallel to the first direction DR1.

FIG. 5A shows the example movement path mp-a of the photographing unit CM that is provided in one component. However, an embodiment is not limited thereto, and the photographing unit CM may be provided in plurality, and the photographing units CM may substantially simultaneously photograph the marking parts MR included in a same processing unit PR. FIG. 5B illustrates example movement paths mp-b1 and mp-b2 of the photographing units CM, respectively.

Referring to FIG. 5B, among the marking parts MR, first and second reference marking parts MR-S1 and MR-S2, from which the photographing units CM starts photographing, may be defined. A first photographing unit among the photographing units CM may continuously move from the first reference marking part MR-S1 along a first movement path mp-b1, and continuously photograph the marking parts MR disposed in an upper side in a plan view of the stage ST. A second photographing unit among the photographing units CM may continuously move from a second reference marking part MR-S2 along a second movement path mp-b2, and continuously photograph the marking parts MR disposed in a lower side in the plan view of the stage ST. Since the photographing units CM substantially simultaneously photograph the marking parts MR, a processing time of the step SS12 for calculating the second position coordinates may be reduced.

The photographing unit CM provided in the step SS11 for calculating the first position coordinates of the marking parts MR may also be provided in plurality, and is not limited to any one, if the photographing unit CM stops at and photographs each of the marking parts MR.

The movement paths mp-a, mp-b1, and mp-b2 of the photographing unit CM shown in FIGS. 5A and 5B are examples, and are not limited to any one, if the marking parts MR disposed in the apparatus PD for manufacturing a mask assembly (see FIG. 3A) are all continuously photographed.

In the step SS12 for calculating the second position coordinates of each of the marking parts MR, the photographing unit CM does not stop at a position at which each of the marking parts MR is disposed, but continuously moves and photographs the marking parts MR. Thus, a loading time required for re-operating the first and second gantries GT1 and GT2 after the stops may be reduced, and a time taken for photographing all the marking parts MR may be shortened.

However, as the photographing unit CM does not stop but continuously moves and photographs the marking parts MR, the positions of the marking parts MR may be shifted in the images of the marking parts MR. In other words, according to a movement direction and a movement speed of the photographing unit CM, the position coordinates, which are calculated through the photographed images, of the marking parts MR may be shifted from the actual positions. For example, in case that the photographing unit CM photographs the images while moving right, the marking parts MR in the photographed images may be shifted left from the actual positions.

The first position coordinates and the second position coordinates of the marking parts MR may be used for calculating the position correction values A. The position correction values A may be calculated in order to correct error values generated in the photographed image of the mask MK (see FIG. 6), as the photographing unit CM continuously moves and photographs the mask MK in the process for manufacturing a mask assembly MA (see FIG. 1). The position correction values A may be calculated in order to correct error values due to a delay, in case that the delay occurs while the control unit CP transfers the trigger signal to the photographing unit CM. In other words, the position correction values A may be used for correcting process errors generated while the photographing unit CM continuously moves and photographs the mask MK (see FIG. 6) in the process for manufacturing a mask assembly MA (see FIG. 1), and be calculated using the first position coordinates and the second position coordinates, which are calculated during auto-teaching data calculation, of the marking parts MR.

In the step SS12 for calculating the position correction values A, difference values may be calculated between the first position coordinates and the second position coordinates for each of the marking units MR. For example, the first position coordinates of one marking unit MR-1 among the marking units MR shown in FIG. 4 may be calculated as (0, D2), and the second position coordinates as (0, D2−a). The differences between the first position coordinates and the second position coordinates of the one marking unit MR-1 may be (0, +a). In this way, the difference values between the first position coordinates and the second position coordinates may be calculated for each of the marking unit MR.

, The average of the calculated difference values may be calculated. For example, difference values of 24 marking parts MR shown in FIGS. 4 and 5A are respectively calculated, and x coordinate values of the 24 difference values may be summed to calculate an average x coordinate, and y coordinate values of the 24 difference values may be summed to calculate an average y coordinate. In an embodiment, the x coordinate value may correspond to the position coordinate in the first direction DR1, and the y coordinate value may correspond to the position coordinate in the second direction DR2.

The average difference values using the difference values of the first position coordinates and the second position coordinates of the marking parts MR may correspond to the position correction values A. For example, the average calculated by summing the x coordinate values among the difference values may correspond to a position correction value in the first direction DR1 and may be defined as a first correction value. The average calculated by summing the y coordinate values among the difference values may correspond to a position correction value in the second direction DR2 and may be defined as a second correction value. The position correction values A may include the first correction value and the second correction value, and be calculated independently from each other.

The position correction values A according to an embodiment may be calculated separately for each period in which the movement speeds of the gantries GT1 and GT2 change. In other words, for each movement period of the first and second gantries GT1 and GT2, the first correction value corresponding to the position correction value in the first direction DR1 and the second correction value corresponding to the position correction value in the second direction DR2 may be calculated.

The position correction values A may be used in the step S20 in which the movement control unit MC calculates the corrected measurement position coordinates in the manufacturing the mask assembly MA (see FIG. 1). In other words, the position correction values A may be used for correcting the error values caused by the photographing unit CM in the step S30 in which the photographing unit CM continuously moves and photographs the openings O-M of the mask MK. Regarding this, detailed description will be provided with reference to FIG. 6.

FIG. 6 is a schematic plan view of the apparatus PD for manufacturing a mask assembly according to an embodiment. FIG. 6 illustrates the mask frame FR and the mask MK being provided inside the apparatus PD for manufacturing a mask assembly shown in FIG. 3A.

Referring to FIG. 6, the mask frame FR may be provided on the stage ST, and the stage ST may support the mask frame FR. The mask MK may be provided on the mask frame FR. However, an embodiment is not limited thereto, and the mask MK may be spaced apart from the mask frame FR on the body unit BD according to the step for manufacturing the mask assembly. In an embodiment, the stage ST, the marking parts MR, the mask frame FR, and the mask MK may be defined as the processing unit PR.

FIG. 6 illustrates an example mask MK provided in a stick type, but an embodiment of the mask MK is not necessarily limited thereto. In FIG. 6 illustrates one example mask MK for convenience of description, but masks MK may also be provided on the mask frame FR.

The openings O-M, which penetrate through the mask MK, may be provided in the mask MK. The openings O-M of the mask MK may define the deposition areas in the above-described deposition process. Accordingly, the positions of the openings O-M may influence the accuracy of the deposition areas. Therefore, in order to improve the reliability of the mask MK, the apparatus PD for manufacturing a mask assembly may confirm, by using the photographing unit CM, the arrangement and positions of the openings O-M provided in the mask MK.

In order to confirm the arrangement and positions of the openings O-M in the mask MK, measurement position coordinates at which the openings O-M are photographed may be set in the movement control unit MC. At an instant in case that the first and second gantries GT1 and GT2 and the photographing unit CM position at the measurement position coordinates set in the movement control unit MC, the movement control unit MC may transfer a signal to the control unit CP, and the control unit CP may transfer a trigger signal to the photographing unit CM to turn on the photographing unit CM. In other words, the photographing unit CM is turned on to photograph the openings O-M of the mask MK at the instant in case that the photographing unit CM passes through the measurement position coordinates set in the movement control unit MC, while the photographing unit CM continuously moves on the mask MK by the first and second gantries GT1 and GT2.

The method for manufacturing a mask assembly according to an embodiment may include the step S20 in which the movement control unit MC calculates the corrected measurement position coordinates, before the step S30 for photographing the mask MK using the photographing unit CM. In the step S20 for calculating the corrected measurement position coordinates, the movement control unit MC may add the position correction values A, calculated by the method for calculating auto-teaching data, to the measurement position coordinates to calculate the corrected measurement position coordinates. Accordingly, the photographing unit CM may continuously move on the mask MK to be turned on for each of the corrected measurement position coordinates to photograph the openings O-M of the mask MK. After the position correction values A are applied to the movement control unit MC, the step for calculating the position correction values A may not be repeated and omitted, and the movement control unit MC may be continuously used for manufacturing the mask assembly MA.

In case that the arrangement and positions of the openings O-M are confirmed using the images obtained by photographing the openings O-M at the measurement position coordinates to which the position correction values A are not added, the error values generated by the photographing unit CM, which continuously moves, may not be corrected. In other words, in case that the position correction values A are not reflected, the arrangement and positions of the openings O-M may be shifted in the images of the openings O-M photographed by the continuously moving photographing unit CM. Accordingly, in case that the position correction values A are not reflected, the differences between the arrangement and positions measured through the photographed images of the openings O-M and the actual arrangement and positions of the openings O-M may become greater, and thus the reliability of the process for manufacturing the mask assembly may be lowered.

However, in case that the position correction values A are added to the measurement position coordinates, the error values generated by the continuously moving photographing unit MC may be corrected, and through this, the measured arrangement and positions of the openings O-M may be improved in accuracy. Accordingly, the process reliability of manufacturing the mask assembly according to an embodiment may be improved.

In the apparatus PD for manufacturing a mask assembly, the photographing unit CM does not stop, but continuously moves and acquires the images of the openings O-M of the mask MK. Accordingly, a time taken in the step S30 for photographing the openings O-M in order to confirm the arrangement and positions of the openings O-M may be reduced. In other words, the reliability of the process for manufacturing the mask assembly may be improved and the process time may be reduced.

The degree of tension of the mask MK may be determined using the arrangement and positions, measured using the photographing unit CM, of the openings O-M. This may correspond to the step S40 for setting the degree of tension of the mask MK using the positions of the openings O-M in the method for manufacturing a mask assembly. The tensioner TS may tension the mask MK by the set degree of tension. As the accuracy of the arrangement and positions of the openings O-M is improved, the reliability of the tension process of the mask MK may also be improved.

The mask MK tensioned by means of the tensioner TS may be disposed on the mask frame FR to be combined to the mask frame FR. A part overlapping the mask frame FR in the tensioned mask MK may be welded by a welding machine, and the tensioned mask MK and the mask frame FR may be bonded to each other by the welding. The mask frame FR and the mask MK bonded to the mask frame FR may provide the mask assembly MA (see FIG. 1).

FIGS. 7 to 10 are schematic plan views of components of the processing unit PR according to an embodiment.

The marking parts MR according to an embodiment may be disposed on at least any one among the components of the processing unit PR in the processing unit PR, and the processing unit PR may have various types of embodiments according to a configuration in which the marking parts MR are disposed. FIGS. 7 to 10 briefly illustrate schematic plan views of the various embodiments of the processing unit PR. In FIGS. 7 to 10, the support body SP (see FIG. 3A) is omitted, and example marking parts MR provided as the pattern PP (see FIG. 3A) are shown. However, an embodiment of the marking parts MR may be modified and applied to any one among the above-described embodiments, and is not particularly limited.

Figure 7:
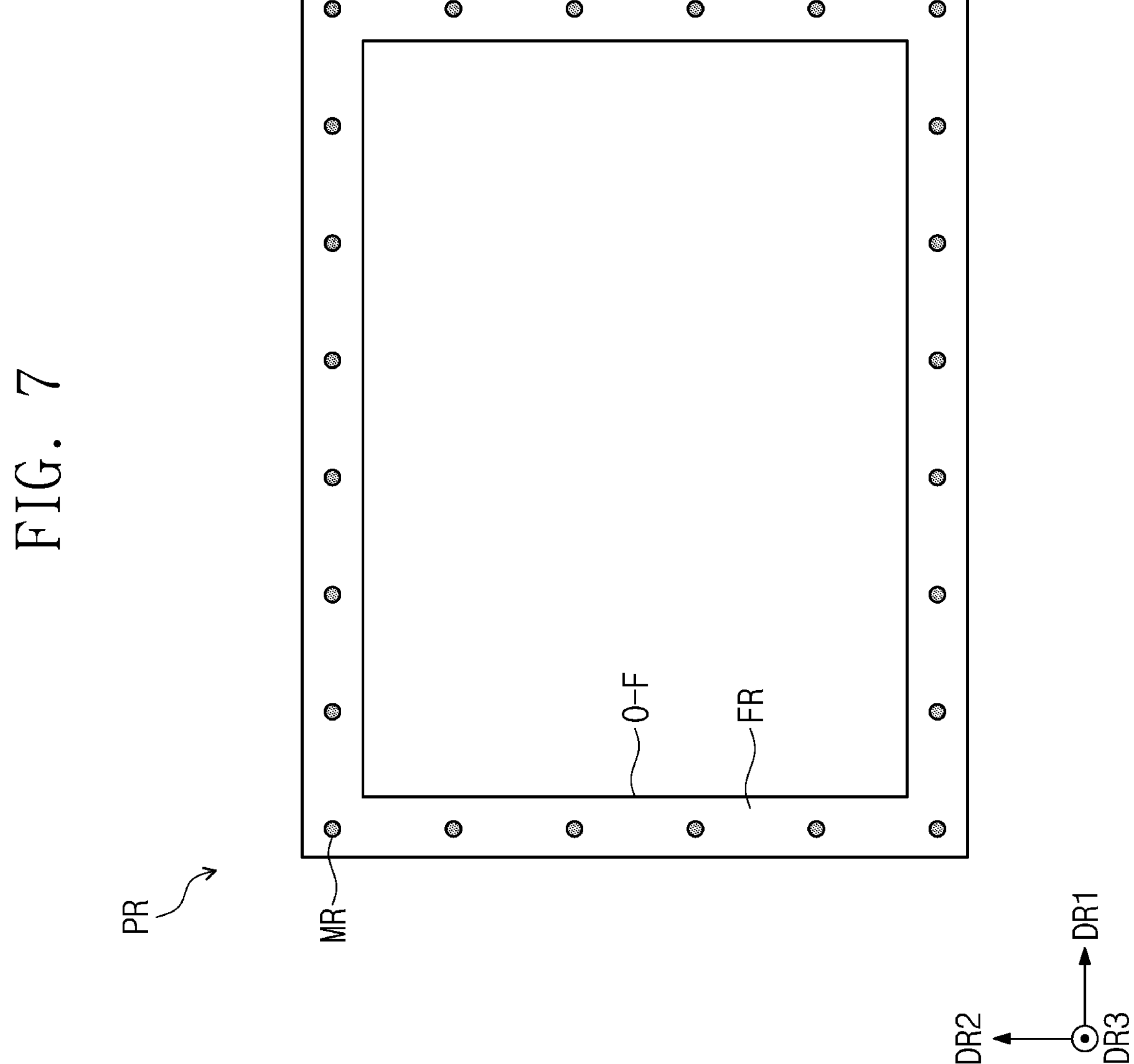
FIG. 7 is a schematic plan view of a component of a processing unit according to an embodiment.

Referring to FIG. 7, the marking parts MR may be disposed on the mask frame FR. The frame opening O-F may be defined inside the mask frame FR, and the marking parts MR may be disposed to be spaced apart from the frame opening O-F.

The mask frame FR may include parts that surround the frame opening O-F and each extend in the first direction DR1 or the second direction DR2, and the marking parts MR may be arranged along the first direction DR1 and the second direction DR2 on the mask frame FR.

The marking parts MR may include a material different from that of the mask frame FR. Through this, the marking parts MR may be distinguished from the mask frame FR in the image, photographed by the photographing unit CM, of the marking parts MR.

In the above-described first position coordinate calculation step SS11 (see FIG. 2A) and second position coordinate calculation step SS12 (see FIG. 2A) of the marking parts MR, the mask frame FR with the marking parts MR disposed thereon may be provided on the stage ST, and the first and second position coordinates of each of the marking parts MR may be calculated using the photographing unit CM.

Figure 8:
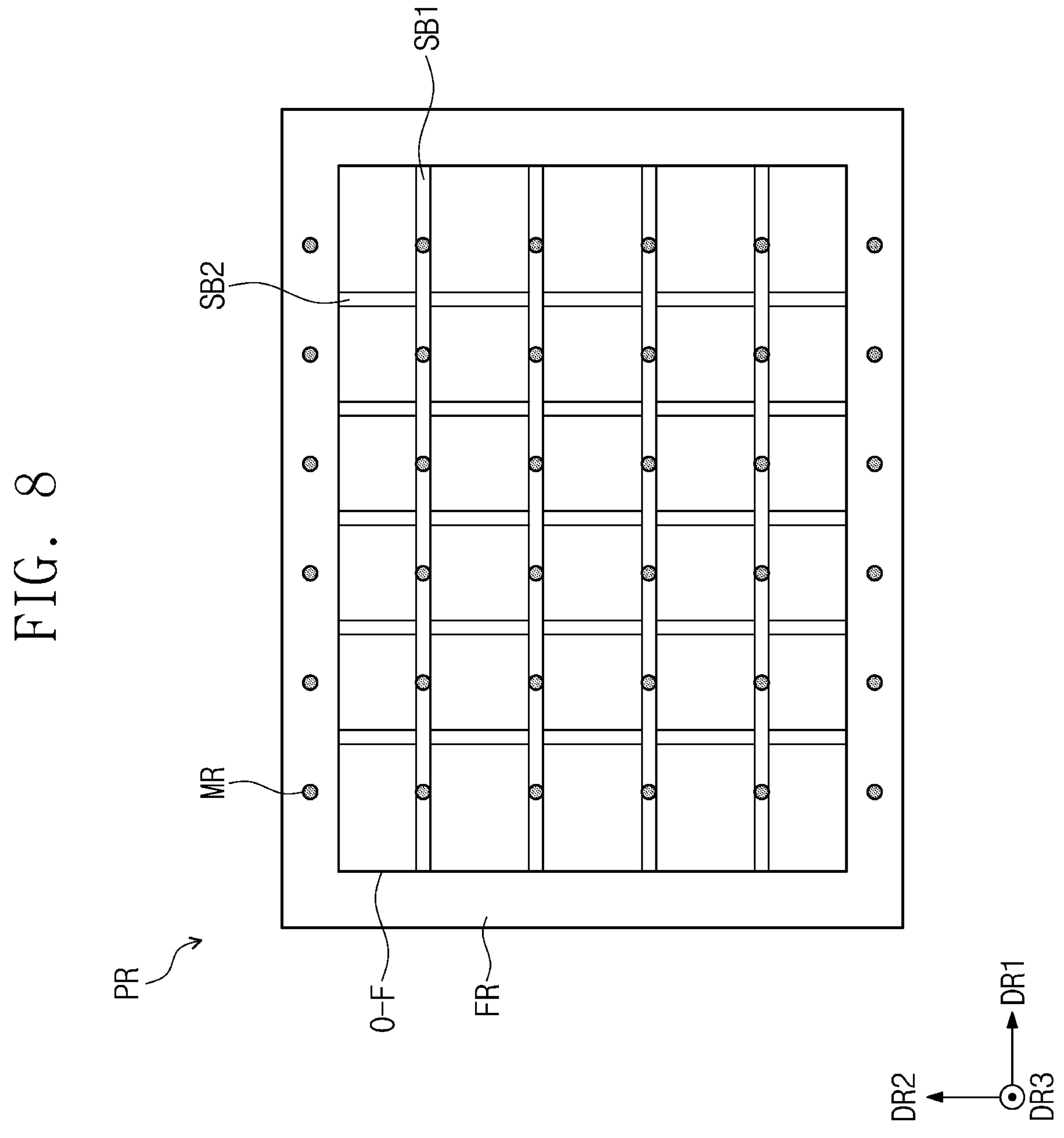
FIG. 8 is a schematic plan view of a component of a processing unit according to an embodiment.

Referring to FIG. 8, the processing unit PR according to an embodiment may further include a first support bar SB1 and a second support bar SB2 combined to the mask frame FR. Each of the first support bar SB1 and the second support bar SB2 may be provided in plurality to be combined to the mask frame FR. However, the numbers of the first and second support bars SB1 and SB2 included in the processing unit PR are not limited to the shown in the drawing.

Each of the first support bars SB1 may extend along the first direction DR1. The first support bars SB1 may be arranged along the second direction DR2. The first support bars SB1 may overlap the frame opening O-F, and be combined to the mask frame FR.

Each of the second support bars SB2 may extend along the second direction DR2. The second support bars SB2 may be arranged along the first direction DR1. The second support bars SB2 may overlap the frame opening O-F, and be combined to the mask frame FR.

The first support bars SB1 and the second support bars SB2 may cross each other within the frame opening O-F. FIG. 8 illustrates an example that the first support bars SB1 are disposed upper than the second support bars SB2, but an embodiment is not limited thereto. The second support bars SB2 may be disposed upper than the first support bars SB1.

FIG. 8 illustrates that an example processing unit PR includes the first support bars SB1 and the second support bars SB2, but an embodiment is not limited thereto. The processing unit PR may further include only the first support bars SB1, or only the second support bars SB2.

The marking parts MR may be disposed on at least one of the first support bars SB1 and the second support bars SB2. The marking parts MR may be disposed on the upper ones of the first support bars SB1 and the second support bars SB2. FIG. 8 illustrates example marking parts MR disposed on the first support bars SB1.

The marking parts MR disposed on one first support bar SB1 may be disposed to be spaced apart by a selectable interval along the first direction DR1. The marking parts MR arranged parallel to the second direction DR2 may be arranged by a selectable interval in the second direction DR2, and respectively disposed on the first support bars SB1 arranged along the second direction DR2.

Some or a number of the marking parts MR may be disposed on the mask frame FR. However, an embodiment is not limited thereto, and the marking parts MR may also be disposed only on the first support bars SB1. The disposition position of the marking parts MR is not limited to any one, if the marking parts MR are arranged by a selectable interval along one direction or in a direction on the mask frame FR to which the first and second support bars SB1 and SB2 are combined.

The first support bars SB1 and the second support bars SB2 may include a same material or a similar material. The first support bars SB1 and the second support bars SB2 may be produced from a same material or a similar material as the mask frame FR. However, embodiments of the first support bars SB1 and the second support bars SB2 are not limited thereto, and may include different materials from the mask frame FR.

The marking parts MR may include a different material from the first support bars SB1 and the second support bars SB2. The marking parts MR in the image of the marking parts MR photographed by the photographing unit CM may be distinguished from the first support bars SB1 or the second support bars SB2.

In the first position coordinates calculation step SS11 (see FIG. 2A) and second position coordinates calculation step SS12 (see FIG. 2A) of the marking parts MR according to an embodiment, the mask frame FR to which the first and second support bars SB1 and SB2 are combined and on which the marking parts MR are disposed may be provided on the stage ST, and the first and second position coordinates of each of the marking parts MR may be calculated using the photographing unit CM.

Figure 9:
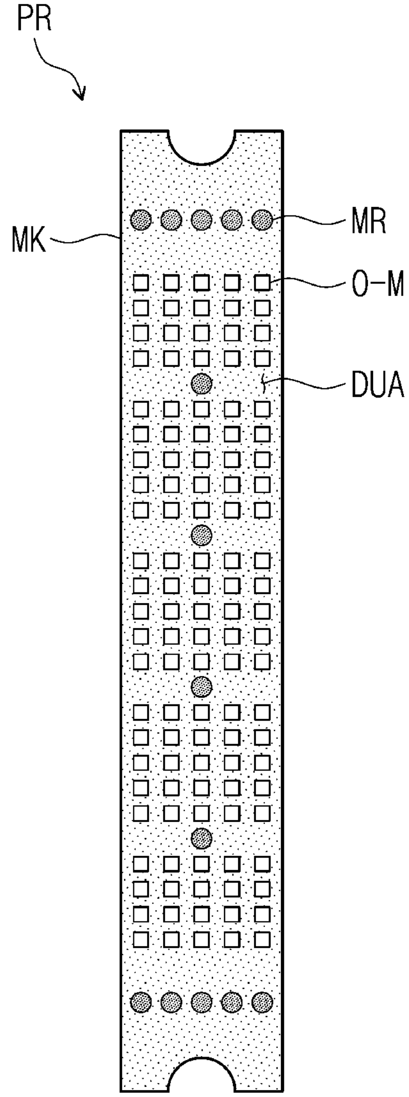
FIG. 9 is a schematic plan view of a component of a processing unit according to an embodiment.
Figure 9:
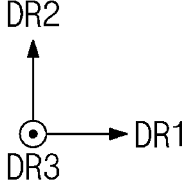

Referring to FIG. 9, the marking parts MR may be disposed on the mask MK. The openings O-M, which penetrate through the mask MK, may be defined in the mask MK. The mask MK may include a dummy area DUA that surrounds the openings O-M, and the marking parts MR may be disposed on the dummy area DUA of the mask MK. The marking parts MR may be disposed to be spaced apart from the openings O-M, and the marking parts MR may not influence the provision of the deposition pattern in the deposition process using the mask MK.

The marking parts MR may be arranged along the first direction DR1 and the second direction DR2 on the mask MK. Among the marking parts MR, marking parts MR arranged along the first direction DR1 may be disposed on the dummy area DUA adjacent to a terminal end of the mask MK. The marking parts MR disposed along the first direction DR1 may be spaced apart by a selectable interval in the first direction DR1. Among the marking parts MR, marking parts MR arranged along the second direction DR2 may be arranged between the openings O-M in a plan view. The marking parts MR disposed along the second direction DR2 may be spaced apart by a selectable interval in the second direction DR2. The arrangement of the marking parts MR is not limited to any one, if the marking parts MR are spaced apart from the openings O-M on the mask MK and are disposed by a selectable interval along one direction or in a direction.

The marking parts MR may include a different material from the mask MK. The marking parts MR may be distinguished from the mask MK in the image, photographed by the photographing unit CM, of the marking parts MR.

In an embodiment, each of the marking parts MR may be provided with marking openings that penetrate through the mask MK. The marking openings may be provided with openings having different shapes or areas from the openings O-M of the mask MK. Through this, the marking openings may be distinctly distinguished from the openings O-M of the mask MK.

In the first position coordinates calculation step SS11 (see FIG. 2A) and second position coordinates calculation step SS12 (see FIG. 2A) of the marking parts MR according to an embodiment, the mask MK with the marking parts MR disposed thereon may be provided on the mask frame FR, or on the body unit BD of the apparatus PD for manufacturing a mask assembly, and the first and second position coordinates of each of the marking parts MR may be calculated using the photographing unit CM.

Figure 10:
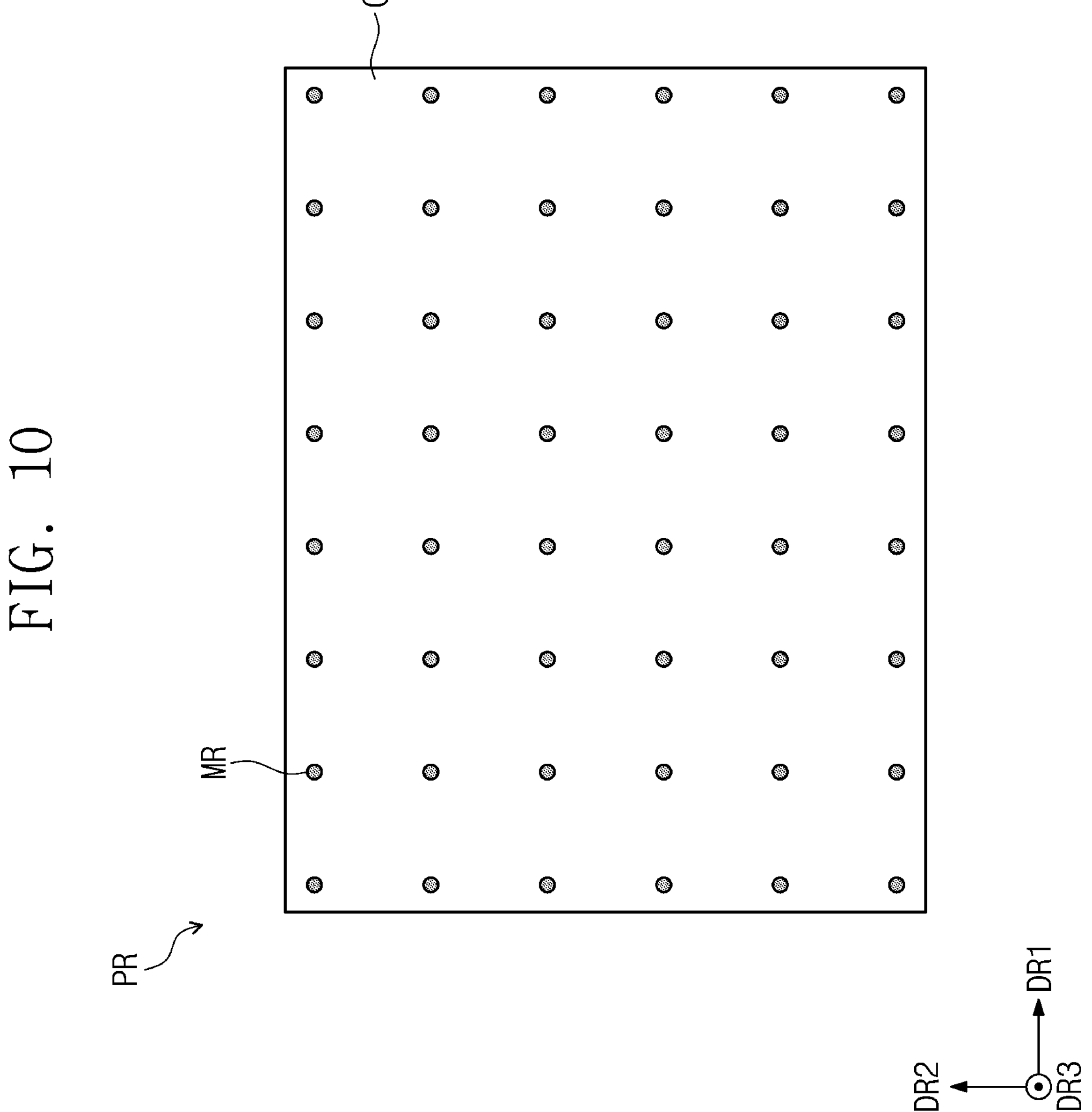
FIG. 10 is a schematic plan view of a component of a processing unit according to an embodiment.

Referring to FIG. 10, the processing unit PR may further include a plate GL. The plate GL may have a top surface parallel to a plane defined by the first direction DR1 and the second direction DR2.

The plate GL may include a transparent material. For example, the plate GL may include glass. However, the material of the plate GL is not limited thereto.

The marking parts MR may be arranged along the first direction DR1 and the second direction DR2 on the plate GL. The marking parts MR arranged along the first direction DR1 may be spaced apart by a selectable interval in the first direction DR1, and the marking parts MR arranged long the second direction DR2 may be spaced apart by a selectable interval in the second direction DR2.

The marking parts MR may include a different material from the plate GL. The marking parts MR may be distinguished from the plate GL in the image, photographed by the photographing unit CM, of the marking parts MR.

In the first position coordinates calculation step SS11 (see FIG. 2A) and second position coordinates calculation step SS12 (see FIG. 2A) of the marking parts MR according to an embodiment, the plate GL may be provided on the stage ST, or on the body unit BD, and the first and second position coordinates of each of the marking parts MR may be calculated using the photographing unit CM.

In the method for manufacturing a mask assembly MA using the apparatus PD for manufacturing a mask assembly according to an embodiment, in order to confirm the arrangement and positions of the openings O-M of the mask MK, the photographing unit CM may continuously move to photograph the openings O-M at each of the corrected measurement position coordinates. Through this, a time taken for photographing the openings O-M of the mask MK may be reduced.

The method for calculating auto-teaching data according to an embodiment may calculate the position correction values A using the marking parts MR disposed in the processing unit PR of the apparatus PD for manufacturing a mask assembly, and the method for manufacturing a mask assembly MA according to an embodiment may calculate the corrected measurement position coordinates using the position correction values A. As the measurement position coordinates are corrected, error values may be corrected, wherein the error values indicate that the measurement target is shifted in the image of the mask MK photographed by the continuously moving photographing unit CM. Accordingly, the reliability of a process for measuring the arrangement and positions of the openings O-M of the mask MK may be improved, and the reliability of the step for setting the degree of tension of mask MK using the arrangement and positions of the openings O-M may also be improved.

In case that the mask assembly MA is manufactured using the position correction values A calculated by the method for calculating auto-teaching data using the method for manufacturing a mask assembly according to an embodiment, the processing time required for manufacturing the mask assembly MA may be reduced and the processing reliability may be improved.

In the method for manufacturing a mask assembly MA according to an embodiment, the photographing unit CM may photograph the openings O-M of the mask MK at each of the set measurement position coordinates, while continuously moving, and the degree of tension of the mask MK may be set using the images of the openings O-M. As the photographing unit CM photographs the openings O-M while continuously moving, the time taken to photograph the openings may be reduced.

In the method for manufacturing a mask assembly MA according to an embodiment, the measurement position coordinates at which the photographing unit CM is turned on may be corrected using the position correction values calculated by the method for calculating auto-teaching data. Through this, an error value may be corrected, the error value being generated while the photographing unit CM continuously moves, and thus the reliability for result values calculated through the photographed image may be improved.

While this disclosure has been described with reference to embodiments thereof, it will be clear to those of ordinary skill in the art to which the disclosure pertains that various changes and modifications may be made to the described embodiments without departing from the spirit and scope of the disclosure and as defined in the appended claims and their equivalents.

Thus, the scope of the disclosure shall not be restricted or limited by the foregoing description, but shall also be determined by the broadest permissible interpretation of the following claims.

What is claimed is:

1. A method for calculating auto-teaching data comprising:

providing a processing unit comprising a stage, a plurality of marking parts, a mask, and a mask frame;

at least one photographing unit stopping at and photographing each of the plurality of marking parts to calculate first position coordinates of each of the plurality of marking parts;

the at least one photographing unit continuously moving along the plurality of marking parts and photographing while moving the plurality of marking parts to calculate second position coordinates of each of the plurality of marking parts; and calculating position correction values using differences between the first position coordinates and the second position coordinates, wherein the plurality of marking parts are disposed in a first direction and a second direction intersecting the first direction.

2. The method for calculating auto-teaching data according to claim 1, wherein the position correction values correspond to average values of the differences between the first position coordinates and the second position coordinates of the plurality of marking parts.

3. The method for calculating auto-teaching data according to claim 1, wherein among the plurality of marking parts, marking parts disposed in the first direction are disposed by a same first interval, and among the plurality of marking parts, marking parts disposed in the second direction are disposed by a same second interval.

4. The method for calculating auto-teaching data according to claim 3, wherein the position correction values comprise:

a first correction value corresponding to a position correction in the first direction; and a second correction value corresponding to a position correction in the second direction, and the first correction value and the second correction value are calculated independently from each other.

5. The method for calculating auto-teaching data according to claim 1, wherein the photographing unit is provided in plurality, and the plurality of photographing units substantially simultaneously photograph marking parts disposed at different positions among the plurality of marking parts.

6. A method for manufacturing a mask assembly comprising:

providing, on a photographing unit, a processing unit comprising a stage, a mask, and a mask frame;

a movement control unit calculating corrected measurement position coordinates using position correction values calculated by a method for calculating auto-teaching data;

the photographing unit photographing openings defined in the mask, in case that positioning at the corrected measurement position coordinates while continuously moving on the mask; and setting a degree of tension of the mask using positions of the openings measured through photographed images of the openings, wherein the method for calculating auto-teaching data comprises:

the photographing unit stopping at and photographing each of a plurality of marking parts provided in the processing unit to calculate first position coordinates of each of the plurality of marking parts;

the photographing unit continuously moving along the plurality of marking parts and photographing while moving the plurality of marking parts to calculate second position coordinates of each of the plurality of marking parts; and calculating the position correction values using differences between the first position coordinates and the second position coordinates.

7. The method for manufacturing a mask assembly according to claim 6, wherein the movement control unit outputs a signal to the photographing unit at each of the corrected measurement position coordinates, and the photographing unit is turned on by the signal to photograph the openings of the mask.

8. The method for manufacturing a mask assembly according to claim 6, further comprising:

tensioning the mask by the degree of tension and then welding the mask on the mask frame.

* * * * *